United States Patent
Akabori et al.

(10) Patent No.: US 8,258,753 B2
(45) Date of Patent: Sep. 4, 2012

(54) SECONDARY BATTERY REMAINING CAPACITY ESTIMATING APPARATUS

(75) Inventors: Kouichi Akabori, Yokohama (JP); Utaka Kamishima, Kawasaki (JP)

(73) Assignee: Nissan Motor Co., Ltd., Yokohama (JP)

( * ) Notice: Subject to any disclaimer, the term of this patent is extended or adjusted under 35 U.S.C. 154(b) by 313 days.

(21) Appl. No.: 12/811,497

(22) PCT Filed: Mar. 2, 2009

(86) PCT No.: PCT/IB2009/000395
§ 371 (c)(1),
(2), (4) Date: Jul. 1, 2010

(87) PCT Pub. No.: WO2009/109832
PCT Pub. Date: Sep. 11, 2009

(65) Prior Publication Data
US 2010/0289454 A1   Nov. 18, 2010

(30) Foreign Application Priority Data
Mar. 7, 2008 (JP) .................................. 2008-057259

(51) Int. Cl.
*H01M 10/44* (2006.01)
*H01M 10/46* (2006.01)
(52) U.S. Cl. ........................................................ 320/132
(58) Field of Classification Search ................. 320/107, 320/128, 132, 149, DIG. 21; 324/426, 427, 324/433
See application file for complete search history.

(56) References Cited

U.S. PATENT DOCUMENTS

| | | | | |
|---|---|---|---|---|
| 6,472,847 B2* | 10/2002 | Lundberg | ...................... | 320/132 |
| 7,227,335 B2* | 6/2007 | Sakakibara et al. | .......... | 320/132 |
| 2007/0046260 A1* | 3/2007 | Ishikawa | ...................... | 320/124 |
| 2008/0150491 A1* | 6/2008 | Bergveld et al. | .............. | 320/139 |

FOREIGN PATENT DOCUMENTS

| JP | H7-151841 A | 6/1995 |
|---|---|---|
| JP | H9-171065 A | 6/1997 |

OTHER PUBLICATIONS

Extended International Search Report of the corresponding International Application No. PCT/IB2009/000395, Jul. 7, 2009.

\* cited by examiner

*Primary Examiner* — Edward Tso
(74) *Attorney, Agent, or Firm* — Global IP Counselors, LLP

(57) ABSTRACT

A secondary battery remaining capacity estimating apparatus basically includes a secondary battery, a charge/discharge determining section, a remaining capacity estimating section, a remaining capacity indicating section and a remaining capacity indication limiting section. The charge/discharge determining section determines if the secondary battery is charging or discharging. The remaining capacity estimating section estimates a remaining electric power capacity of the secondary battery. The remaining capacity indicating section indicates a remaining capacity of the secondary battery based on an estimation value by the remaining capacity estimating section. The remaining capacity indication limiting section limits a decrease of a remaining capacity indicated upon determining that the secondary battery is charging and the estimation value will decrease, and limits an increase of a remaining capacity indicated upon determining that the secondary battery is discharging and the estimation value will increase.

20 Claims, 11 Drawing Sheets

SECONDARY BATTERY REMAINING CAPACITY ESTIMATING APPARATUS

CROSS-REFERENCE TO RELATED APPLICATIONS

This U.S. National stage application claims priority to Japanese Patent Application No. 2008-057259, filed on Mar. 7, 2008. The entire disclosure of Japanese Patent Application No. 2008-057259 is hereby incorporated herein by reference.

BACKGROUND

1. Field of the Invention

The present invention generally relates to a secondary battery remaining capacity estimating apparatus for estimating a remaining capacity of a secondary battery.

2. Background Information

There are basically two main methods for estimating the remaining capacity of a battery. The first is to estimate the remaining capacity of the battery by integrating a current value (hereinafter called a "current integration method"). The other is to use a relationship between an open circuit voltage and the remaining battery capacity to estimate the remaining capacity of the battery based on the open circuit voltage (hereinafter called an "open circuit voltage method"). However, both of these estimation methods have advantages and disadvantages. Japanese Patent Publication No. 3640142 discloses a battery remaining capacity indicating apparatus that selects between the two methods just described in accordance with a condition of the secondary battery and estimate the remaining capacity of the battery using the selected method. The battery remaining capacity indicating apparatus calculates a difference between an estimation value obtained using the current integration method and an estimation value obtained using the open circuit voltage method and compares the difference to a prescribed value. If the difference is below the prescribed value, then the estimation value obtained using the current integration method is indicated as the remaining capacity of the battery. If the difference is above the prescribed value, then the estimation value obtained using the current integration method is gradually decreased and the decreased estimation value is indicated as the remaining capacity of the battery In this way, a more accurate estimation of the remaining capacity of the battery can be indicated.

SUMMARY

It has been discovered that with the battery remaining capacity indicating apparatus, mentioned above, the indicated estimation valve sometimes changes differently from the manner in which the actual remaining capacity is changing. For example, there are situations in which the indicated estimation value decreases even though the battery is charging and situations in which the indicated estimation value increases even though the battery is discharging. This discrepancy can seem odd to a driver.

The present invention was conceived in view of the discrepancy problem just described. One object of the present invention is to provide a secondary battery remaining capacity estimating apparatus that can alleviate the odd feeling imparted to a driver.

In accordance with a first aspect, a secondary battery remaining capacity estimating apparatus is provided that basically comprises a secondary battery, a charge/discharge determining section, a remaining capacity estimating section, a remaining capacity indicating section and a remaining capacity indication limiting section. The charge/discharge determining section determines if the secondary battery is charging or discharging. The remaining capacity estimating section estimates a remaining electric power capacity of the secondary battery. The remaining capacity indicating section indicates a remaining capacity of the secondary battery based on an estimation value by the remaining capacity estimating section. The remaining capacity indication limiting section limits a decrease of a remaining capacity being indicated by the remaining capacity indicating section when the charge/discharge determining section has determined that the secondary battery is charging and the estimation value obtained by the remaining capacity estimating section will decrease. The remaining capacity indication limiting section limits an increase of a remaining capacity being indicated by the remaining capacity indicating section when the charge/discharge determining section has determined that the secondary battery is discharging and the estimation value obtained by the remaining capacity estimating section will increase.

These and other objects, features, aspects and advantages of the present invention will become apparent to those skilled in the art from the following detailed description, which, taken in conjunction with the annexed drawings, discloses preferred embodiments.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 1:
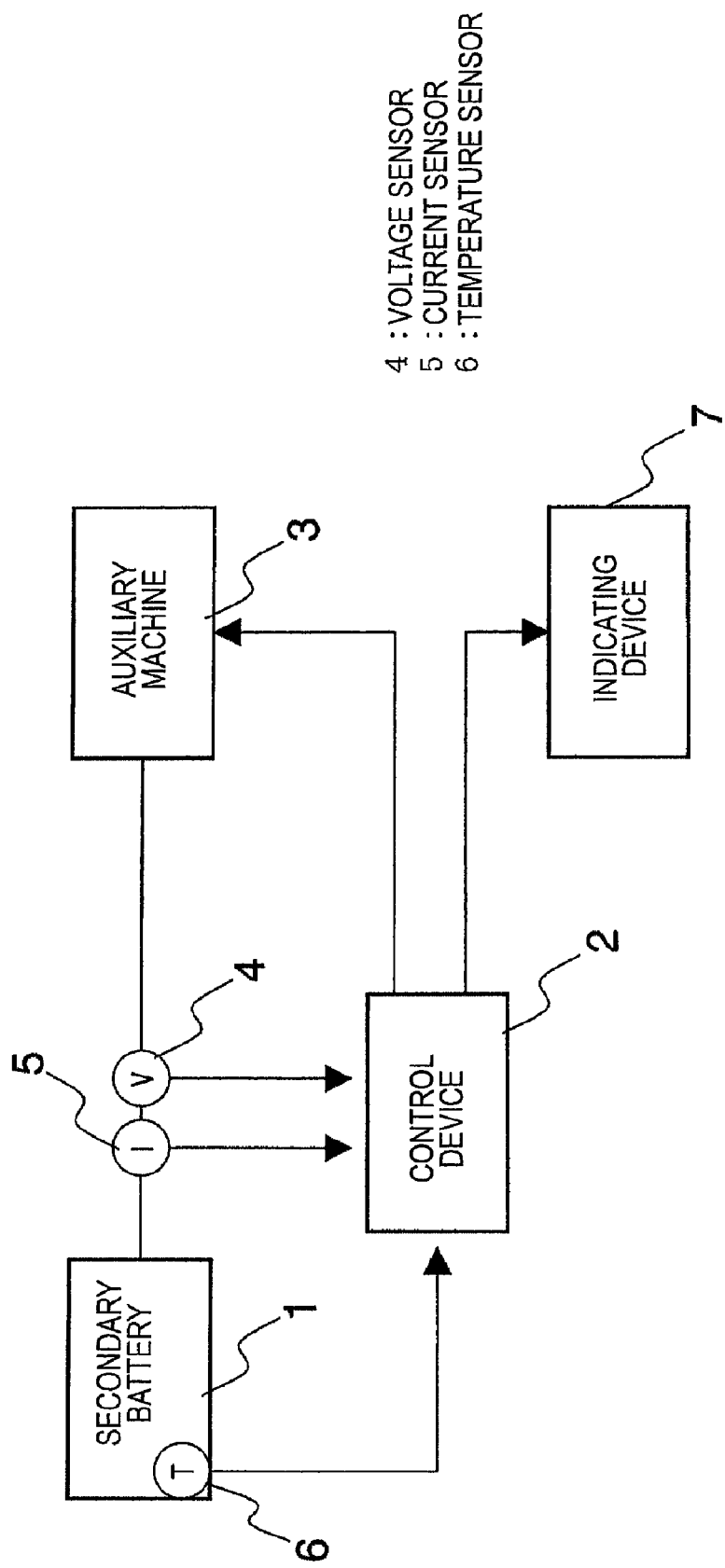
FIG. 1 is a block diagram of an electric power vehicle including a control device with a secondary battery remaining capacity estimating apparatus in accordance with a first embodiment.

Referring initially to FIG. 1, a block diagram of an electric power vehicle is illustrated that includes a secondary battery 1, and a control device 2 with a secondary battery remaining capacity estimating apparatus in accordance with a first embodiment in accordance with a first embodiment. The control device 2 can be used in a hybrid vehicle (HEV), an electric vehicle (EV), or other electric powered vehicle. The remaining capacity estimating apparatus will now be explained in terms of a first embodiment, and first to third variations of the first embodiment with reference to FIGS. 1 to 12.

FIG. 1 is a block diagram of constituent elements peripheral to a secondary battery 1 of the electric powered vehicle containing the control device 2 in accordance with a first embodiment. As shown in FIG. 1, in addition to the secondary battery 1, and the control device 2, the electric powered vehicle is equipped with an auxiliary machine 3 (e.g., an electric motor), a voltage sensor 4, a current sensor 5, a temperature sensor 6 and an indicating device 7. The indicating device 7 serves as a remaining capacity indicating device. The secondary battery 1 serves to supply electric power to the auxiliary machine 3 and store electric power generated by the auxiliary machine 3. The current sensor 5 serves to measure a charge/discharge current of the secondary battery 1. The current sensor 5 measures a charge current of the secondary battery 1 as a positive (+) value and a discharge current as a negative (−) value.

The voltage sensor 4 serves to measure a terminal voltage of the secondary battery 1. The temperature sensor 6 serves to measure a temperature of the secondary battery 1. The measurement results obtained by the current sensor 5, the voltage sensor 4, and the temperature sensor 6 are fed to the control device 2. The control device 2 comprises a CPU, a memory device, and the like. The control device 2 estimates a remaining capacity of the secondary battery 1 with a secondary battery remaining capacity estimating apparatus 20 (see FIG. 2). As explained below, the secondary battery remaining capacity estimating apparatus 20 can prevent the estimation value from decreasing during charging and increasing during discharging, thereby suppressing the occurrence situations in which a driver experience an odd feeling that something is odd about an indicated remaining capacity of the secondary battery. The control device 2 further protects the secondary battery 1 by limiting charge currents from the auxiliary machine 3 and discharge currents to the auxiliary machine 3 based on a third remaining capacity estimation value described later. The control device 2 also sends a fourth remaining capacity estimation value (described later) to the indicating device 7. A remaining capacity estimation value is an estimated value of the remaining capacity of the secondary battery 1. The indicating device 7 is a device contrived to convey various kinds of information to a driver driving the electric powered vehicle. One piece of information the indicating device 7 indicates is the remaining capacity of the secondary battery 1. In the first embodiment, the indicating device 7 indicates a remaining capacity of the secondary battery 1 to the driver based on the fourth remaining capacity estimation value sent from the control device 2.

Figure 2:
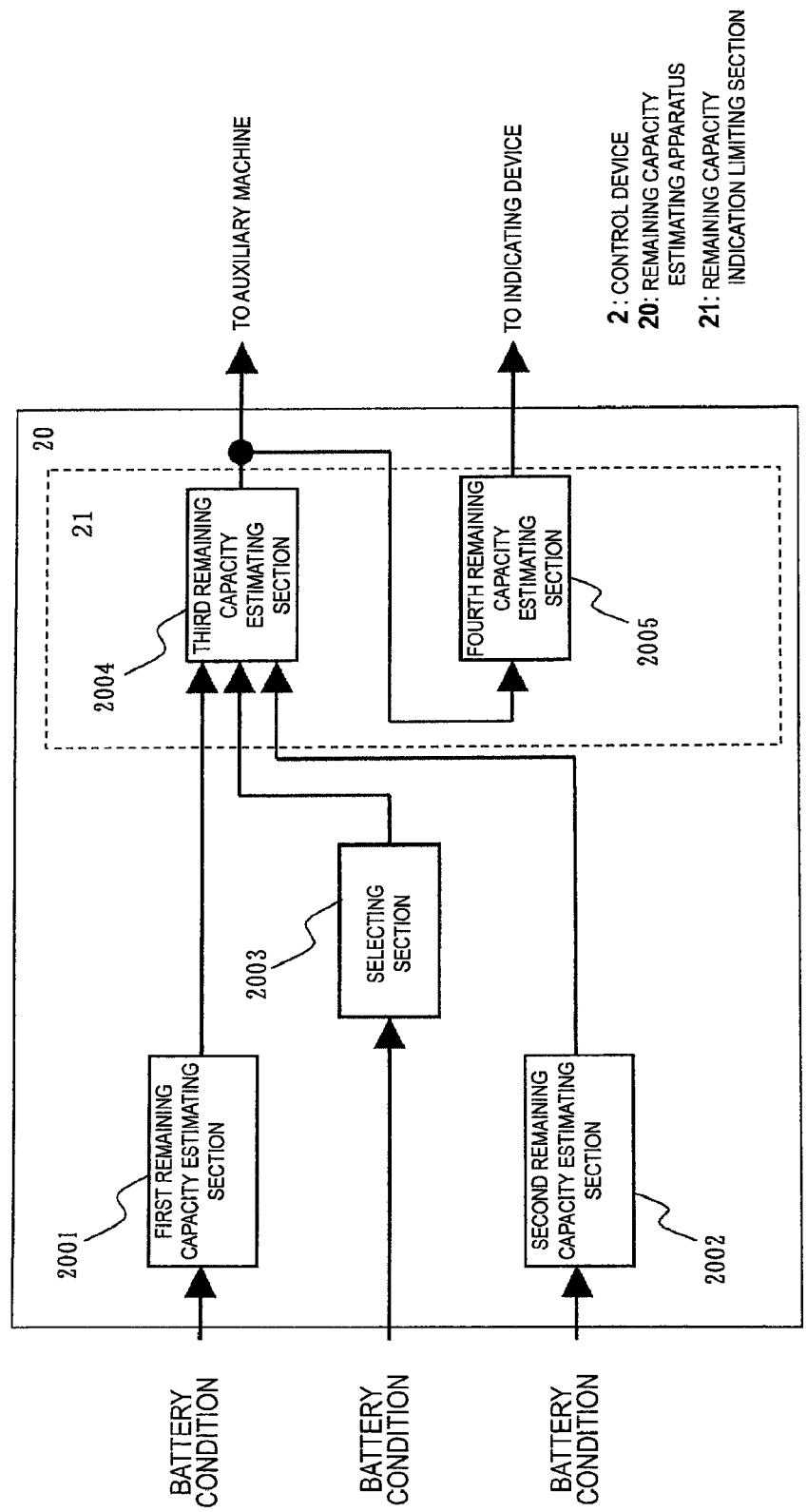
FIG. 2 is a block diagram showing internal components of the control device shown in FIG. 1.

FIG. 2 is a block diagram showing internal components of the control device shown in FIG. 1. As shown in FIG. 2, the control device 2 includes the remaining capacity estimating apparatus 20 that serves to estimate a remaining capacity of the secondary battery 1. The remaining capacity estimating apparatus 20 includes a first remaining capacity estimating section 2001, a second remaining capacity estimating section 2002 and a selecting section 2003. The remaining capacity estimating apparatus 20 also includes a third remaining capacity estimating section 2004 and a fourth remaining capacity estimating section 2005. Together, the third remaining capacity estimating section 2004 and the fourth remaining capacity estimating section 2005 constitute a remaining capacity indication limiting section 21. The remaining capacity estimating apparatus 20 also includes a charge/discharge control device (not shown) for controlling charging and discharging of the secondary battery 1 based on the third remaining capacity estimation value. The first remaining capacity estimating section 2001 estimates a remaining capacity of the secondary battery 1 based on a condition of the secondary battery 1. The resulting estimation value is set as a first remaining capacity estimation value. More specifically, as will be described later, the first remaining capacity estimating section 2001 computes an amount of change of the remaining capacity based on a current value measured by the current sensor 5. The amount of change (change amount) is added to the first remaining capacity estimation value from the previous control cycle. The resulting sum becomes the first remaining capacity estimation value of the current control cycle. The estimation method employed by the first remaining capacity estimating section 2001 is the current integration method.

The second remaining capacity estimating section 2002 uses a different estimation method from the first remaining capacity estimating section 2001 to estimate the remaining capacity of the secondary battery 1 based on a condition of the secondary. The resulting estimation value is set as a second remaining capacity estimation value. More specifically, the second remaining capacity estimating section 2002 estimates an open circuit voltage based on a terminal voltage measured by the voltage sensor 4, the secondary battery temperature measured by the temperature sensor 6 and the current value mentioned above. Then, using a prepared relationship between the open circuit voltage and the remaining capacity, the second remaining capacity estimating section 2002 computes the second remaining capacity estimation value based on the estimated open circuit voltage. The estimation method employed by the first remaining capacity estimating section 2002 is the current integration method. The selecting section 2003 selects either the first remaining capacity estimation value or the second remaining capacity estimation value in accordance with a usage condition of the secondary battery 1. For example, normally the first remaining capacity estimation value obtained with the current integration method is selected. However, when the aforementioned current value remains at substantially zero, the terminal voltage can be assumed to be substantially an open circuit voltage and the second remaining capacity estimation value obtained with the open circuit voltage method is selected. The selection logic of the selecting section 2003 is not limited to that just described.

The third remaining capacity estimating section 2004 sets the remaining capacity estimation value selected by the selecting section 2003, i.e., either the first remaining capacity estimation value or the second remaining capacity estimation value, as a third remaining capacity estimation value. The fourth remaining capacity estimating section 2005 computes a fourth remaining capacity estimation value based on the third remaining capacity estimation value. The fourth remaining capacity estimating section 2005 sends the fourth remaining capacity estimation value to the indicating device 7. As will be explained later, the fourth remaining capacity estimating section 2005 also computes a difference by subtracting the fourth remaining capacity estimation value of the previous control cycle from the third remaining capacity estimation value of the current control cycle. If the sign of the difference is negative (−) and the secondary battery 1 is charging or if the sign of the difference is positive (+) and the secondary battery 1 is discharging, then the fourth remaining capacity estimation value of the previous control cycle is set as the fourth remaining capacity estimation value of the current control cycle.

Figure 3:
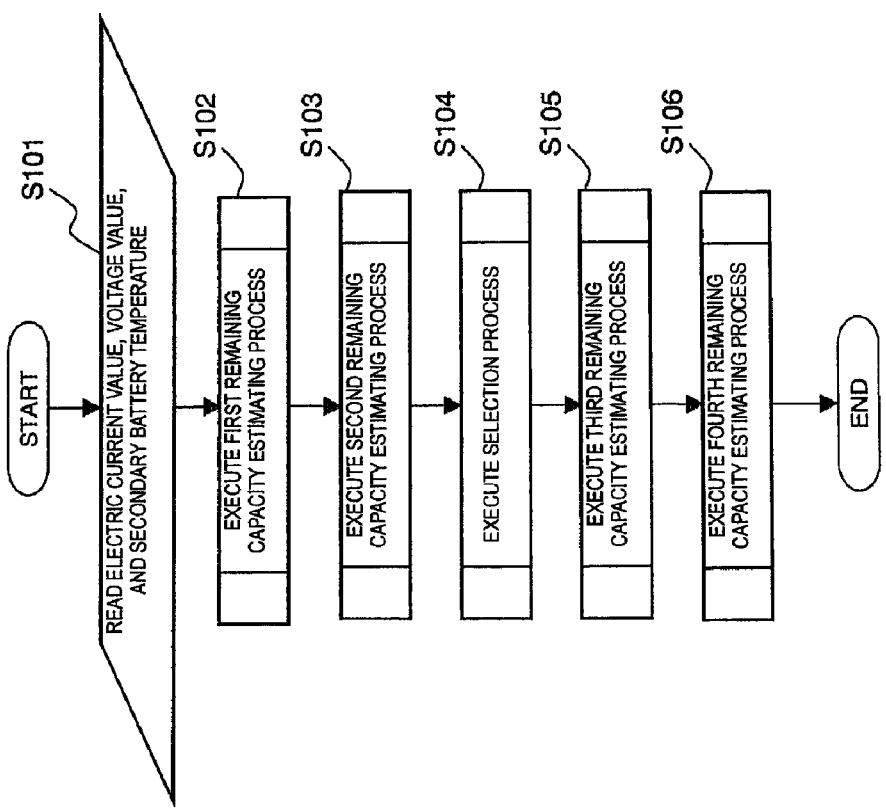
FIG. 3 is a flowchart showing the control processing executed by the remaining capacity estimating apparatus shown in FIG. 2.

The control processing executed by the remaining capacity estimating apparatus 20 according to the first embodiment will now be explained with reference to FIG. 3. FIG. 3 is a flowchart showing the control processing executed by the remaining capacity estimating apparatus 20 shown in FIG. 2. The remaining capacity estimating apparatus 20 executes the sequence of controls shown in FIG. 3 once per prescribed cycle time (e.g., once per 0.01 second). As shown in FIG. 3, the remaining capacity estimating apparatus 20 first reads in a voltage value measured by the voltage sensor 4, a current value measured by the current sensor 5, and a secondary battery temperature measured by the temperature sensor 6 (step S101). The first remaining capacity estimating section 2001 executes a first remaining capacity estimation process (step S102) and the second remaining capacity estimating section 2002 executes a second remaining capacity estimation process (step S103). The selecting section 2003 then executes a selection process (step S104) and the third remaining capacity estimating section 2004 executes a third remaining capacity estimating process (step S105). Next, the fourth remaining capacity estimating section 2005 executes a fourth remaining capacity estimating process (step S106). Thereafter, the remaining capacity estimating apparatus 20 repeats the control sequence (steps S101 through S106) once per prescribe cycle time.

Figure 4:
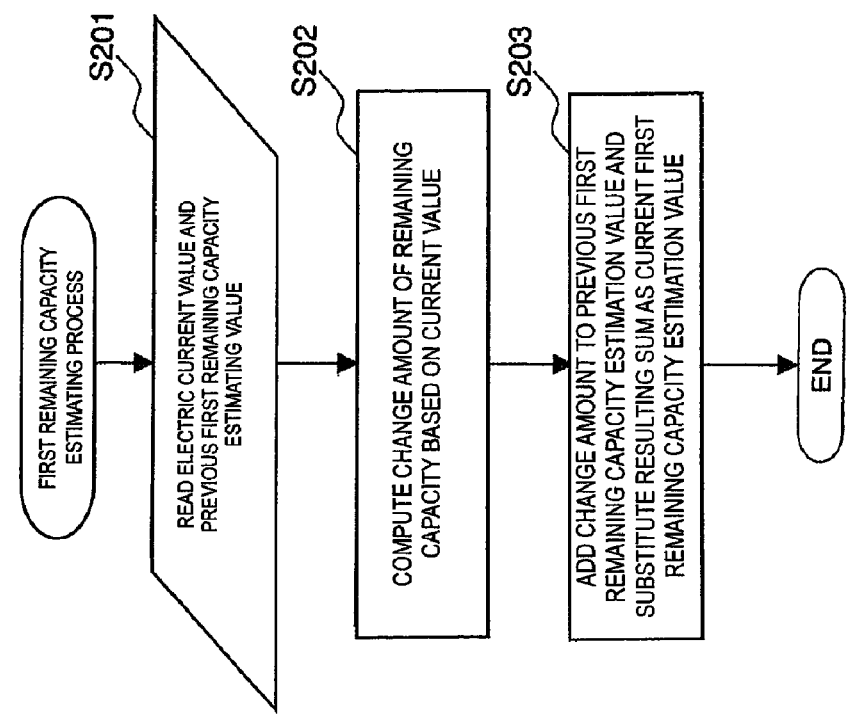
FIG. 4 is a flowchart showing the detailed steps of the first remaining capacity estimating process shown in FIG. 3.

The first to fourth remaining capacity estimating processes shown in FIG. 3 will now be explained in more detail with reference to FIGS. 4 to 7. FIG. 4 is a flowchart showing the detailed steps of the first remaining capacity estimating process shown in FIG. 3. As shown in FIG. 4, the first remaining capacity estimating section 2001 reads in the aforementioned current value and the first remaining capacity estimation value from the previous control cycle (step S201). The first remaining capacity estimating section 2001 then uses the Equation (1) shown below to compute a change amount of the remaining capacity based on the aforementioned current value (step S202).

$$\text{Remaining capacity change amount } (Ah) = \text{current value} \times \text{computation cycle time}/(60 \times 60) \quad \text{Equation (1)}$$

The first remaining capacity estimating section 2001 adds the change amount computed in step S202 to the first remaining capacity estimation value from the previous control cycle and substitutes the resulting sum value as the first remaining capacity estimation value of the current control cycle (step S203). The first remaining capacity estimating section 2001 then ends the first remaining capacity estimation process.

Figure 5:
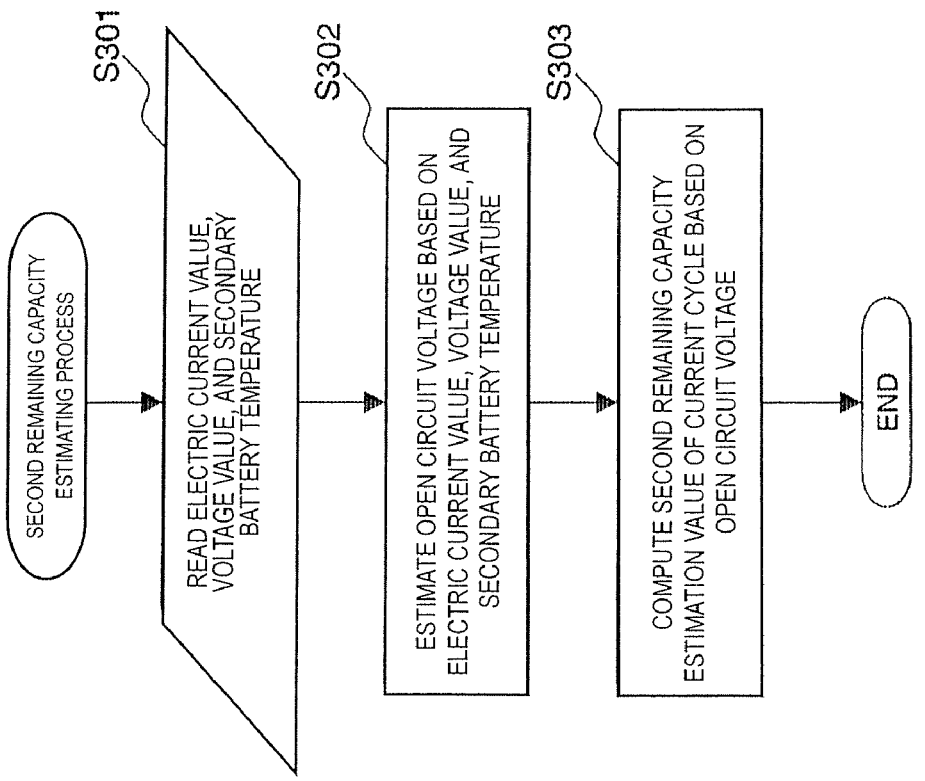
FIG. 5 is a flowchart showing the detailed steps of the second remaining capacity estimating process shown in FIG. 3.

FIG. 5 is a flowchart showing the detailed steps of the second remaining capacity estimating process shown in FIG. 3. As shown in FIG. 5, the second remaining capacity estimating section 2002 reads in the aforementioned voltage value, the aforementioned current value, and the aforementioned secondary battery temperature (step S301). The second remaining capacity estimating section 2002 estimates an internal resistance based on the aforementioned voltage value, aforementioned current value, and aforementioned secondary battery temperature. The second remaining capacity estimating section 2002 then uses the Equation (2) shown below to compute an open circuit voltage based on the estimated internal resistance (step S302).

$$\text{Open circuit voltage} = \text{voltage value} + \text{current value} \times \text{internal resistance} \quad \text{Equation (2)}$$

Next, the second remaining capacity estimating section 2002 uses a prepared relationship between the open circuit voltage and the remaining capacity to compute a second remaining capacity estimation value of the current control cycle based on the estimated open circuit voltage (step S303). The second remaining capacity estimating section 2002 then ends the second remaining capacity estimation process.

Figure 6:
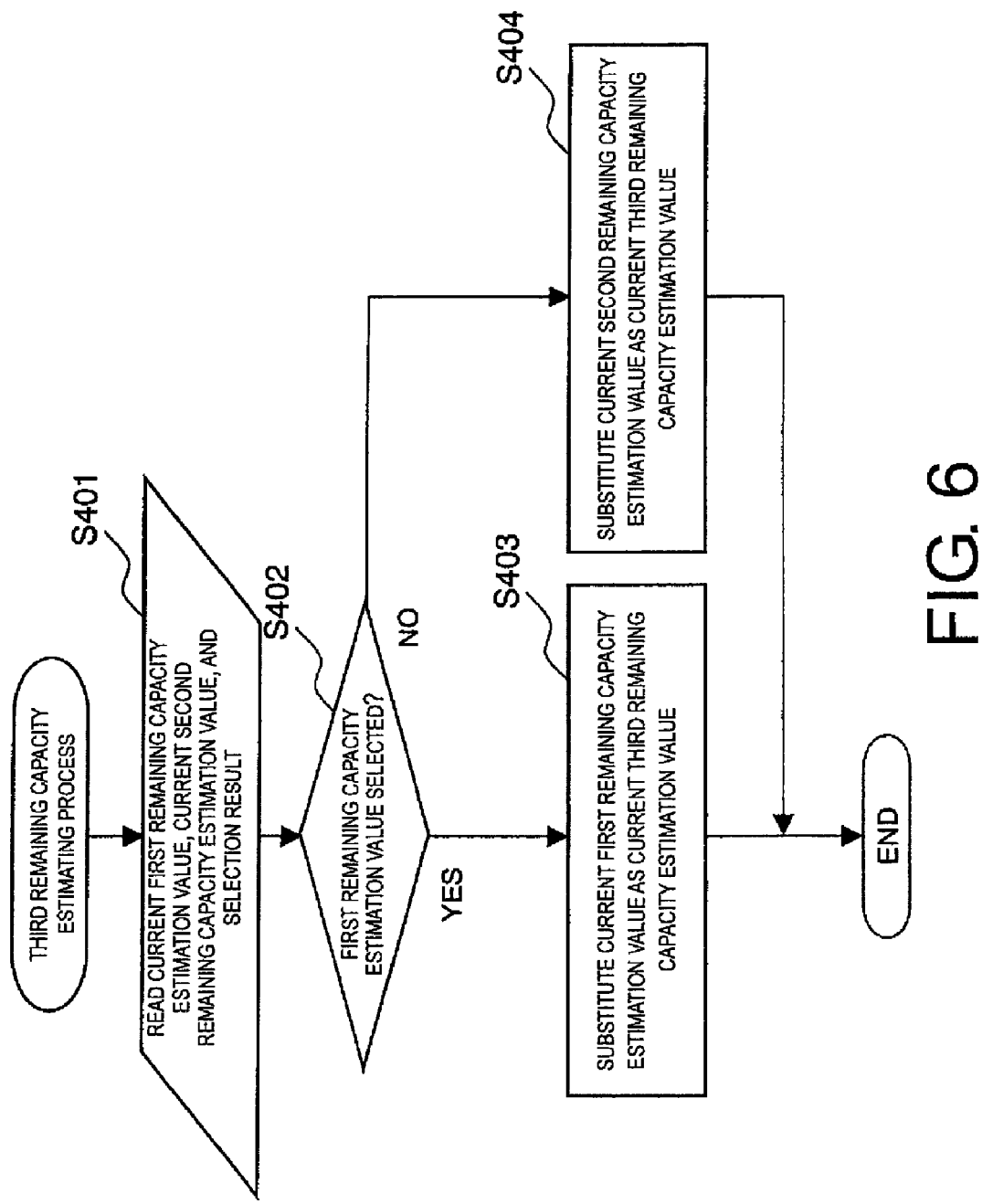
FIG. 6 is a flowchart showing the detailed steps of the third remaining capacity estimating process shown in FIG. 3.

FIG. 6 is a flowchart showing the detailed steps of the third remaining capacity estimating process shown in FIG. 3. As shown in FIG. 6, the third remaining capacity estimating section 2004 reads in the first remaining capacity estimation value of the current control cycle, the second remaining capacity estimation value of the current control cycle, and the selection result of the selecting section 2003 (step S401). Then, based on the selection result, the third remaining capacity estimating section 2004 then determines if the first remaining capacity estimation value was selected (step S402). If it determines that the first remaining capacity estimation value was selected (i.e., if the result of step S402 is Yes), then the third remaining capacity estimating section 2004 substitutes the first remaining capacity estimation value of the current control cycle as a third remaining capacity estimation value of the current control cycle (step S403). Meanwhile, if it determines that the first remaining capacity estimation value was not selected (i.e., if the result of step S402 is No), then the third remaining capacity estimating section 2004 substitutes the second remaining capacity estimation value of the current control cycle as the third remaining capacity estimation value of the current control cycle (step S404). The third remaining capacity estimating section 2004 then ends the third remaining capacity estimation process.

Figure 7:
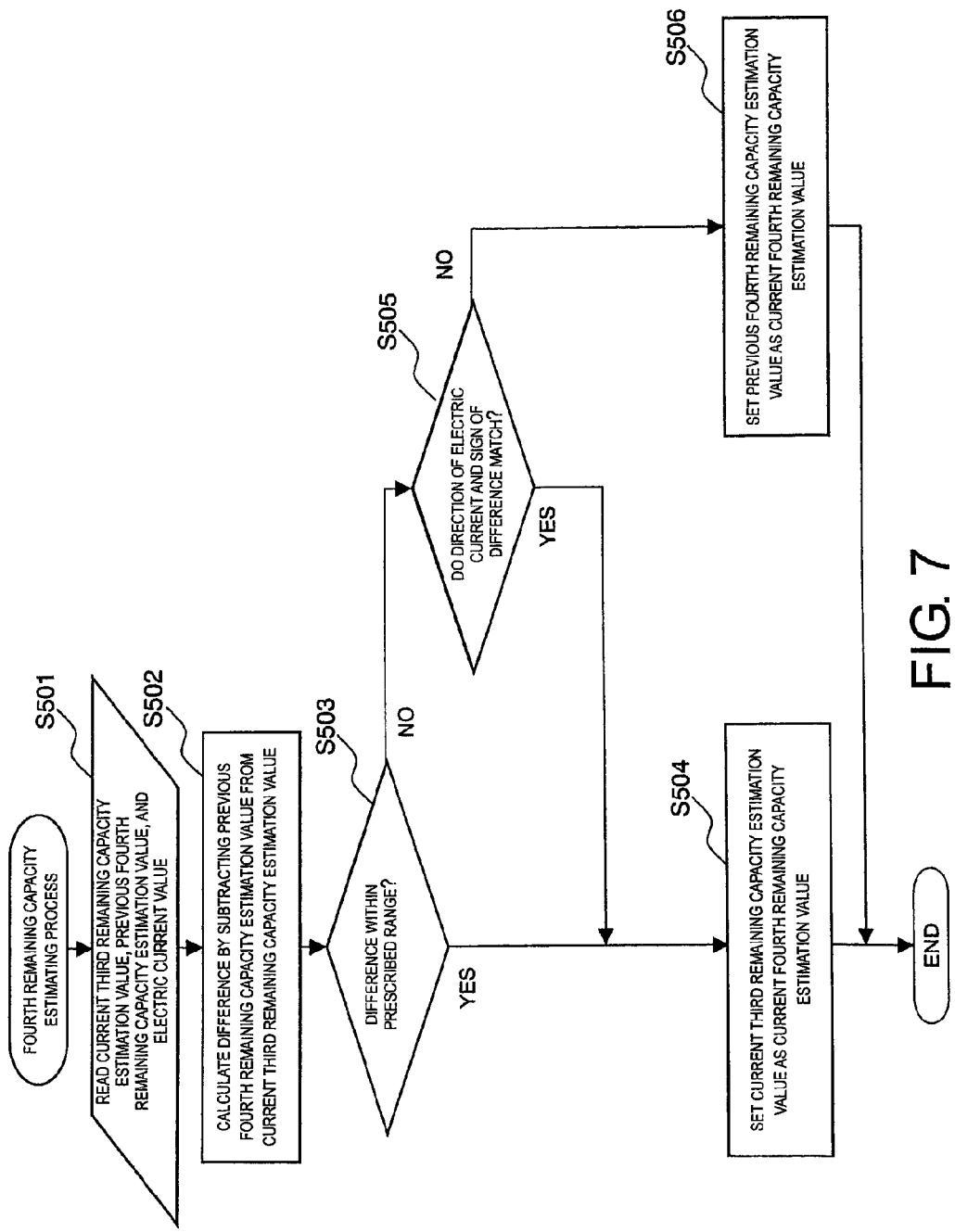
FIG. 7 is a flowchart showing the detailed steps of the fourth remaining capacity estimating process shown in FIG. 3.

FIG. 7 is a flowchart showing the detailed steps of the fourth remaining capacity estimating process shown in FIG. 3. As shown in FIG. 7, the fourth remaining capacity estimating section 2005 reads in the aforementioned current value, the third remaining capacity estimation value of the current control cycle, and the fourth remaining capacity estimation value from the previous control cycle (step S501). Next, the fourth remaining capacity estimating section 2005 finds a difference by subtracting the fourth remaining capacity estimation value of the previous control cycle from the third remaining capacity estimation value of the current estimation cycle (step S502). Then, the fourth remaining capacity estimating section 2005 determines if the difference is within a prescribed range (step S503). If it determines that the difference is within the prescribed range (i.e., if the result of step S503 is Yes), then the fourth remaining capacity estimating section 2005 proceeds to step S504. In step S504, the fourth remaining capacity estimating section 2005 substitutes the third remaining capacity estimation value of the current control cycle as a fourth remaining capacity estimation value of the current control cycle regardless of whether the secondary battery 1 is charging or discharging and regardless of the sign of the aforementioned difference.

Meanwhile, if it determines that the aforementioned difference is outside the prescribed range (i.e., if the result of step S503 is No), then the fourth remaining capacity estimating section 2005 determines if the direction of the electric current and the sign of the difference match (i.e., are the same) (step S505). In this embodiment, it is assumed that the direction of the electric current is positive (+) when the secondary battery 1 is charging and negative (−) when the secondary battery 1 is discharging. Thus, the direction of the electric current and the sign of the difference match when the sign of the difference is positive (+) while the secondary battery 1 is charging or when the sign of the difference is negative (−) while the secondary battery 1 is discharging. Conversely, the direction of the electric current and the sign of the difference do not match when the sign of the difference is negative (−) while the secondary battery 1 is charging or when the sign of the difference is positive (+) while the secondary battery 1 is discharging. Therefore, in step S505, the fourth remaining capacity estimating section 2005 determines if the sign of the aforementioned difference is negative while the secondary battery 1 is charging, if the sign of the aforementioned difference is positive while the secondary battery 1 is discharging, or if neither of these states exists.

If it determines that the direction of the electric current and the sign of the difference do not match, i.e., if the secondary battery 1 is charging and the sign of the difference is negative (−) or if the secondary battery 1 is discharging and the sign of the difference is positive (+) (i.e., if the result of step S505 is No), then the fourth remaining capacity estimation section 2005 proceeds to step S506. In step S506, the fourth remaining capacity estimating section 2005 substitutes the fourth remaining capacity estimation value from the previous control cycle as the fourth remaining capacity estimation value of the current control cycle. Meanwhile, if it determines that the direction of the electric current and the sign of the difference match, i.e., if neither a state in which the secondary battery 1 is charging and the sign of the difference is negative (−) nor a state in which the secondary battery 1 is discharging and the sign of the difference is positive (+) exists (i.e., if the result of step S505 is Yes), then the fourth remaining capacity estimating section 2005 proceeds to step S504. In step S504, the fourth remaining capacity estimating section 2005 substitutes the third remaining capacity estimation value of the current control cycle as the fourth remaining capacity estimation value of the current control cycle. The fourth remaining capacity estimating section 2005 then ends the fourth remaining capacity estimation process.

Figure 8:
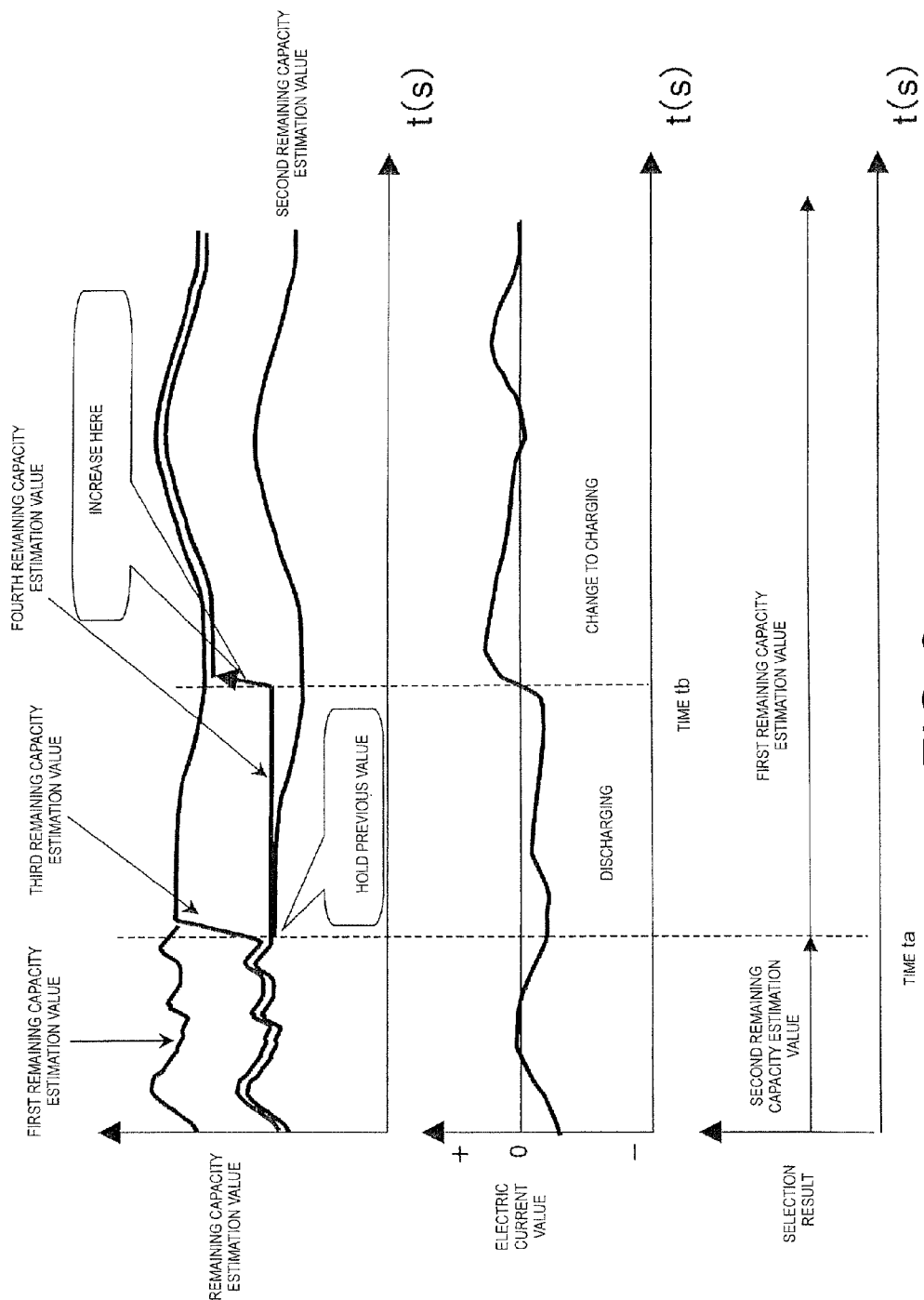
FIG. 8 is a diagram showing how each of the remaining capacity estimation values change when the secondary battery shown in FIG. 1 changes from a discharging state to a charging state.
Figure 9:
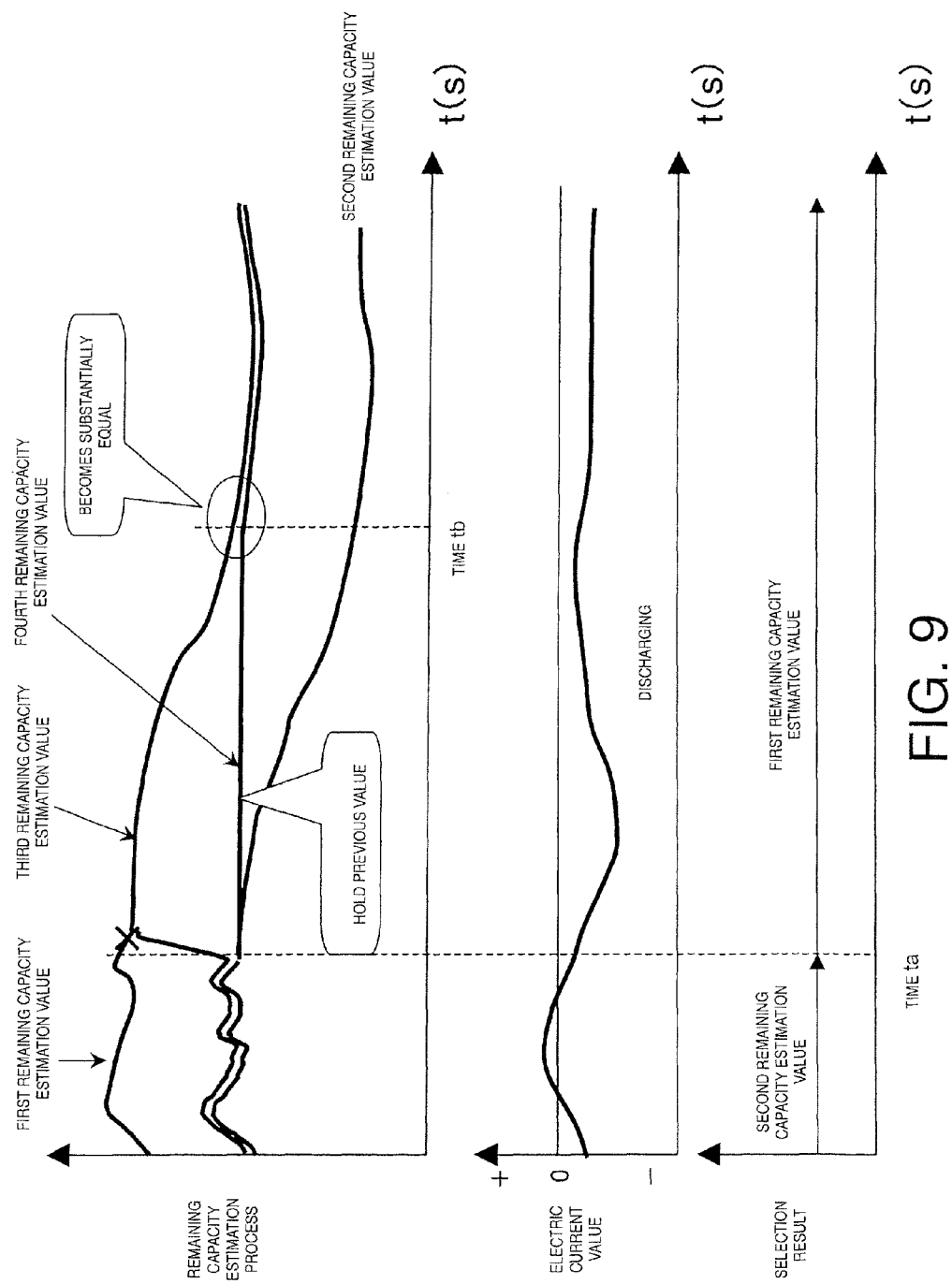
FIG. 9 is a diagram showing how each of the remaining capacity estimation values change when the secondary battery shown in FIG. 1 remains in a discharging state.

The manner in which each of the remaining capacity estimating values estimated by the remaining capacity estimating apparatus 20 change over time in the first embodiment will now be explained with reference to FIGS. 8 and 9. FIG. 8 is a diagram (time chart) showing how each of the remaining capacity estimation values change when the secondary battery 1 shown in FIG. 1 changes from a discharging state to a charging state. FIG. 9 is a diagram (time chart) showing how each of the remaining capacity estimation values changes when the secondary battery 1 shown in FIG. 1 remains in a discharging state. In FIGS. 8 and 9, it is assumed that the first remaining capacity estimation value is larger than the second remaining capacity estimation value. In the graph of the current value, the secondary battery 1 is being charged when the direction of the electric current is positive (+). Meanwhile, the secondary battery 1 is discharging when the direction of the electric current is negative (−).

As shown in FIG. 8, the selecting section 2003 selects the second remaining capacity estimation value until a time ta. Until the time ta, the third remaining capacity estimation value and the fourth remaining capacity estimation value are substantially coincident with the second remaining capacity estimation value. At the time ta, the selecting section 2003 selects the first remaining capacity estimation value and the third remaining capacity estimation value (which depends on the selection) shifts so as to coincide with the first remaining capacity estimation value. The direction of the electric current is negative (−) and the secondary battery 1 is discharging. Additionally, the aforementioned difference is outside the prescribed range and the sign of the difference is positive (+). Thereafter, since the secondary battery 1 is discharging and the third remaining capacity estimation value (selected estimation value) changes in an increasing direction when the selecting section 2003 selects one of the estimation values, the fourth remaining capacity estimating section 2005 limits the change of the third remaining capacity estimation value and sets the limited value as the fourth remaining capacity estimation value of the current control cycle. In other words, the fourth remaining capacity estimation value of the current control cycle is set to the same value as the fourth remaining capacity estimation value from the previous control cycle (i.e., the previously set estimation value).

Until a time tb, the fourth remaining capacity estimating section 2005 holds the fourth remaining capacity estimation value of the current control cycle at the same value as the previous fourth remaining capacity estimation value (i.e., the previously set estimation value) corresponding to the time ta. At the time tb, the electric current direction changes to the positive direction and the secondary battery 1 begins to charge. Additionally, the aforementioned difference is outside the prescribed range and the sign of the difference is positive (+). Thereafter, since the sign of the difference is positive and the secondary battery 1 is charging, the fourth remaining capacity estimating section 2005 cancels the aforementioned limitation. In other words, the fourth remaining capacity estimating section 2005 sets the third remaining capacity estimation value of the current control cycle (i.e., the selected estimation value) as the fourth remaining capacity estimation value of the current control cycle. Afterwards, the fourth remaining capacity estimation value tracks the third remaining capacity estimation value, which equals the estimation value selected in the selection process (i.e., the selected estimation value).

The estimation values are controlled in a similar fashion when the selecting section 2003 switches from selecting the first remaining capacity estimation value to selecting the second remaining capacity estimation value and causes the aforementioned difference to be outside the prescribed range and the sign of the difference to become negative while the current direction is positive and the secondary battery 1 is charging. That is, in a situation in which the secondary battery 1 is charging and the third remaining capacity estimation value changes in a decreasing direction when the selecting section 2003 selects one of the estimation values, the fourth remaining capacity estimating section 2005 limits the change of the third remaining capacity estimation value by setting the fourth remaining capacity estimation value of the current control cycle to the previous fourth remaining capacity estimation value (i.e., the previously set estimation value) corresponding to the time ta. Afterwards, if the direction of the electric current changes to negative (−) and the secondary battery discharges, then the fourth remaining capacity estimating section 2005 cancels the limitation of the change in the third remaining capacity estimation value even though the aforementioned difference is outside the prescribed range because the sign of the difference is negative (−) and the secondary battery 1 is discharging. More specifically, the fourth remaining capacity estimating section 2005 sets the third remaining capacity estimation value of the current control cycle resulting after the selection process as the fourth remaining capacity estimation value of the current control cycle. Afterwards, the fourth remaining capacity estimation value tracks the third remaining capacity estimation value, i.e., the selected estimation value.

As shown in FIG. 9, the selecting section 2003 selects the second remaining capacity estimation value until a time ta. Until the time ta, similarly to the situation depicted in FIG. 8, the third remaining capacity estimation value and the fourth remaining capacity estimation value are substantially coincident with the second remaining capacity estimation value. At the time ta, the selecting section 2003 selects the first remaining capacity estimation value and the third remaining capacity estimation value (which depends on the selection) shifts so as to coincide with the first remaining capacity estimation value. The direction of the electric current is negative (−) and the secondary battery 1 is discharging. Additionally, the aforementioned difference is outside the prescribed range and the sign of the difference is positive (+). Thereafter, since the secondary battery 1 is discharging and the third remaining capacity estimation value changes in an increasing direction when the selecting section 2003 selects one of the estimation values, the fourth remaining capacity estimating section 2005 limits the change of the third remaining capacity estimation value and sets the limited value as the fourth remaining capacity estimation value of the current control cycle. In other words, similarly to the situation depicted in FIG. 8, the fourth remaining capacity estimation value of the current control cycle remains at the same value as the fourth remaining capacity estimation value from the previous control cycle (i.e., the previously set estimation value).

Until a time tb, the fourth remaining capacity estimating section 2005 holds the fourth remaining capacity estimation value of the current control cycle at the same value as the previous fourth remaining capacity estimation value (i.e., the previously set estimation value) corresponding to the time ta. The example depicted in FIG. 9 is different from the example shown in FIG. 8 in that the secondary battery 1 continues to discharge. Consequently, the third remaining capacity estimation value, i.e., the selected estimation value, decreases. As shown in FIG. 9, at the time tb, the third remaining capacity estimation value of the current control cycle (i.e., the selected estimation value) becomes substantially equal to the previous fourth remaining capacity estimation value (previously set estimation value) corresponding to the time ta. Thereafter, since the third remaining capacity estimation value of the current control cycle (i.e., the selected estimation value) is substantially equal to the previous fourth remaining capacity estimation value (previously set estimation value) corresponding to the time ta, the fourth remaining capacity estimating section 2005 cancels the aforementioned limitation. In other words, the fourth remaining capacity estimating section 2005 sets the third remaining capacity estimation value of the current control cycle resulting after the selection process (i.e., the selected estimation value) as the fourth remaining capacity estimation value of the current control cycle. It is also acceptable to configure the apparatus to cancel the aforementioned limitation when the difference obtained by subtracting the previous fourth remaining capacity estimation value (i.e., the previously set estimation value) corresponding to the time ta from the third remaining capacity estimation value of the current control cycle (i.e., the selected estimation value) decreases. Afterwards, the fourth remaining capacity estimation value tracks the third remaining capacity estimation value, i.e., the selected estimation value.

Similarly to the example shown in FIG. 8, the estimation values are controlled in a similar fashion when the selecting section 2003 switches from selecting the first remaining capacity estimation value to selecting the second remaining capacity estimation value and causes the aforementioned difference to be outside the prescribed range and the sign of the difference to become negative while the current direction is positive and the secondary battery 1 is charging. That is, in a situation in which the secondary battery 1 is charging and the third remaining capacity estimation value changes in a decreasing direction when the selecting section 2003 selects one of the estimation values, the fourth remaining capacity estimating section 2005 limits the change of the third remaining capacity estimation value and sets the fourth remaining capacity estimation value of the current control cycle to the previous fourth remaining capacity estimation value (i.e., the previously set estimation value) corresponding to the time ta.

Afterwards, if the third remaining capacity estimation value of the current control cycle (i.e., the selected estimation value) becomes substantially equal to the previous fourth remaining capacity estimation value (i.e., the previously set estimation value) corresponding to the time ta, the fourth remaining capacity estimating section 2005 will cancel the aforementioned limitation. More specifically, the fourth remaining capacity estimating section 2005 sets the third remaining capacity estimation value of the current control cycle resulting after the selection process (i.e., the selected estimation value) as the fourth remaining capacity estimation value of the current control cycle. Afterwards, the fourth remaining capacity estimation value tracks the third remaining capacity estimation value, i.e., the selected estimation value. It is also acceptable to configure the fourth remaining capacity estimating section 2005 to cancel the aforementioned limitation when the difference obtained by subtracting the previous fourth remaining capacity estimation value (i.e., the previously set estimation value) corresponding to the time ta from the third remaining capacity estimation value of the current control cycle (i.e., the selected estimation value) becomes small.

In the first embodiment, the remaining capacity estimating apparatus 20 includes a first remaining capacity estimating section 2001 that estimates a first remaining capacity of the secondary battery 1 based on a condition of the secondary battery 1, a second remaining capacity estimating section 2002 that estimates a second remaining capacity of the secondary battery 1 based on a condition of the secondary battery 1 using a different estimation method than the first remaining capacity estimating section 2001, and a selecting section 2003 that selects either the first remaining capacity estimation value or the second remaining capacity estimation value based on a usage condition of the secondary battery 1. Additionally, the apparatus includes a fourth remaining capacity estimating section 2005 contrived to do the following when the selecting section 2003 selects a first or a second remaining capacity estimation value: limit a change of a third remaining capacity estimation value set to equal the remaining capacity estimation value selected by the selecting section 2003 when the secondary battery 1 is charging and the third remaining capacity estimation value will change in a decreasing direction due to the selection and when the secondary battery 1 is discharging and the third remaining capacity estimation value will change in an increasing direction due to the selection. As a result, the fourth remaining capacity estimation value sent to the indicating device 7 can be prevented from decreasing when the secondary battery 1 is charging and prevented from increasing when the secondary battery is discharging, thereby suppressing the occurrence of an odd feeling imparted to a driver.

The fourth remaining capacity estimating section 2005 included in a secondary battery remaining capacity estimating apparatus 20 in accordance with the first embodiment is contrived to hold the fourth remaining capacity estimation value at a previous fourth remaining capacity estimation value (i.e., previously set estimation value) corresponding to a time ta when the secondary battery 1 is charging and the third remaining capacity estimation value will change in a decreasing direction due to the selection and when the secondary battery 1 is discharging and the third remaining capacity estimation value will change in an increasing direction due to the selection. Thus, the fourth remaining capacity estimation value sent to the indicating device 7 can be prevented from decreasing when the secondary battery 1 is charging and prevented from increasing when the secondary battery is discharging. As a result, the occurrence of an odd feeling being imparted to a driver can be suppressed.

The fourth remaining capacity estimating section 2005 included in a secondary battery remaining capacity estimating apparatus 20 in accordance with the first embodiment is also contrived to cancel the aforementioned limitation when the third remaining capacity estimation value of the current control cycle (i.e., the selected estimation value) becomes substantially equal to the previous fourth remaining capacity estimation value (i.e., the previously set estimation value) corresponding to the time ta. As a result, after the two values are substantially equal, the remaining capacity of the secondary battery 1 indicated by the indicating device 7 can be based on the highly reliable third remaining capacity estimation value.

The fourth remaining capacity estimating section 2005 included in a secondary battery remaining capacity estimating apparatus 20 in accordance with the first embodiment can also be contrived to cancel the aforementioned limitation when a difference between the third remaining capacity estimation value of the current control cycle (i.e., the selected estimation value) and the previous fourth remaining capacity estimation value (i.e., the previously set estimation value) corresponding to the time ta becomes small. In this way, when the effect on the driver will be small, the limitation can be canceled and the remaining capacity of the secondary battery 1 can be indicated accurately by the indicating device 7.

An indicating device 7 in accordance with the first embodiment is contrived to indicate a remaining capacity of the secondary battery 1. When the selecting section 2003 makes a selection, the indicating device 7 indicates the previous fourth remaining capacity estimation value corresponding to the time to in accordance with the limitation imposed by the fourth remaining capacity estimating section 2005. As a result, the fourth remaining capacity estimation value indicated by the indicating device 7 can be prevented from decreasing when the secondary battery 1 is charging and increasing when the secondary battery 1 is discharging, thereby suppressing the occurrence of an odd feeling being imparted to a driver.

The charge/discharge control device included in a secondary battery remaining capacity estimating apparatus 10 according to the first embodiment is configured such that when the selecting section 2003 makes a selection, a charge/discharge control of the secondary battery 1 is executed based on a third remaining capacity estimation value (i.e., selected estimation value) that has not been limited by the fourth remaining capacity estimating section 2005. Thus, the highly reliable third remaining capacity estimation value can be used to compute a limit value of the charge/discharge current. As a result, the secondary battery 1 can be protected in a highly reliable manner while suppressing the occurrence of situations in which the driver experience a feeling that something is odd about the indicated remaining capacity of the secondary battery 1.

Figure 10:
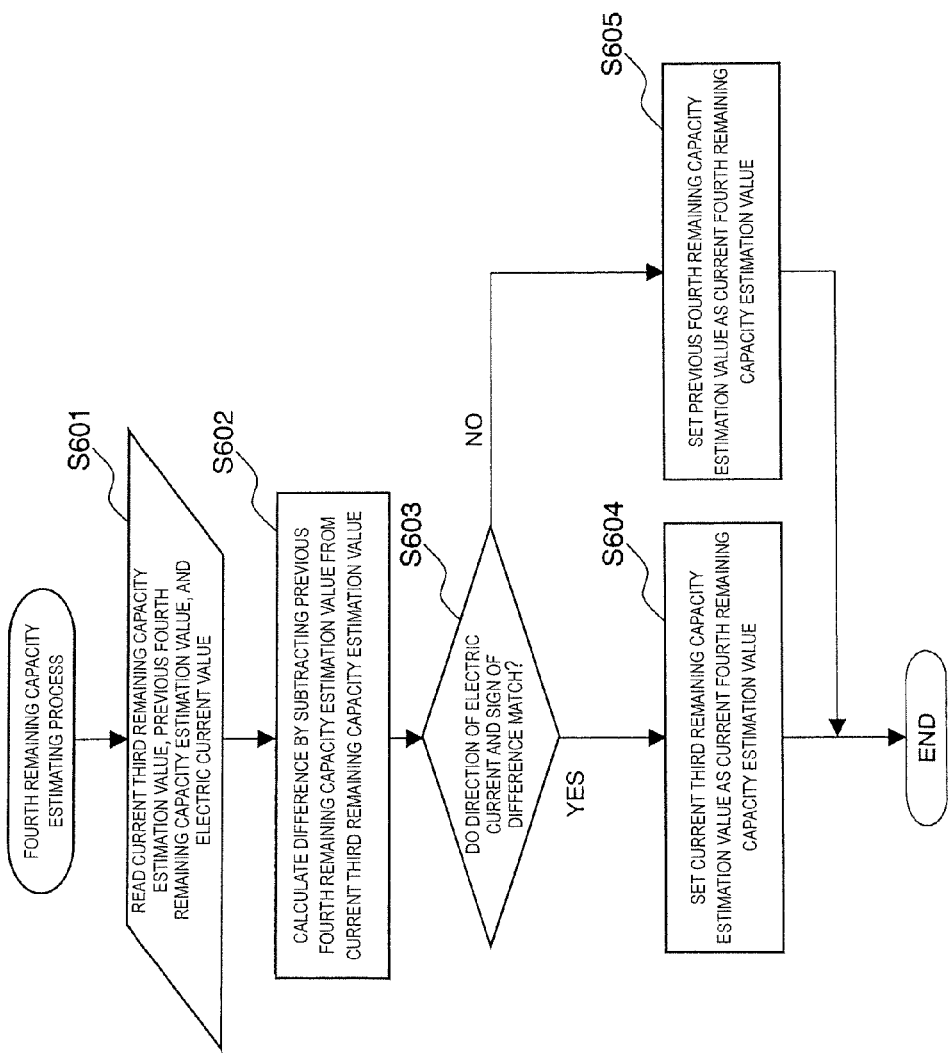
FIG. 10 is a flowchart showing the detailed steps of a fourth remaining capacity estimating process according to a first variation of the first embodiment.
Figure 11:
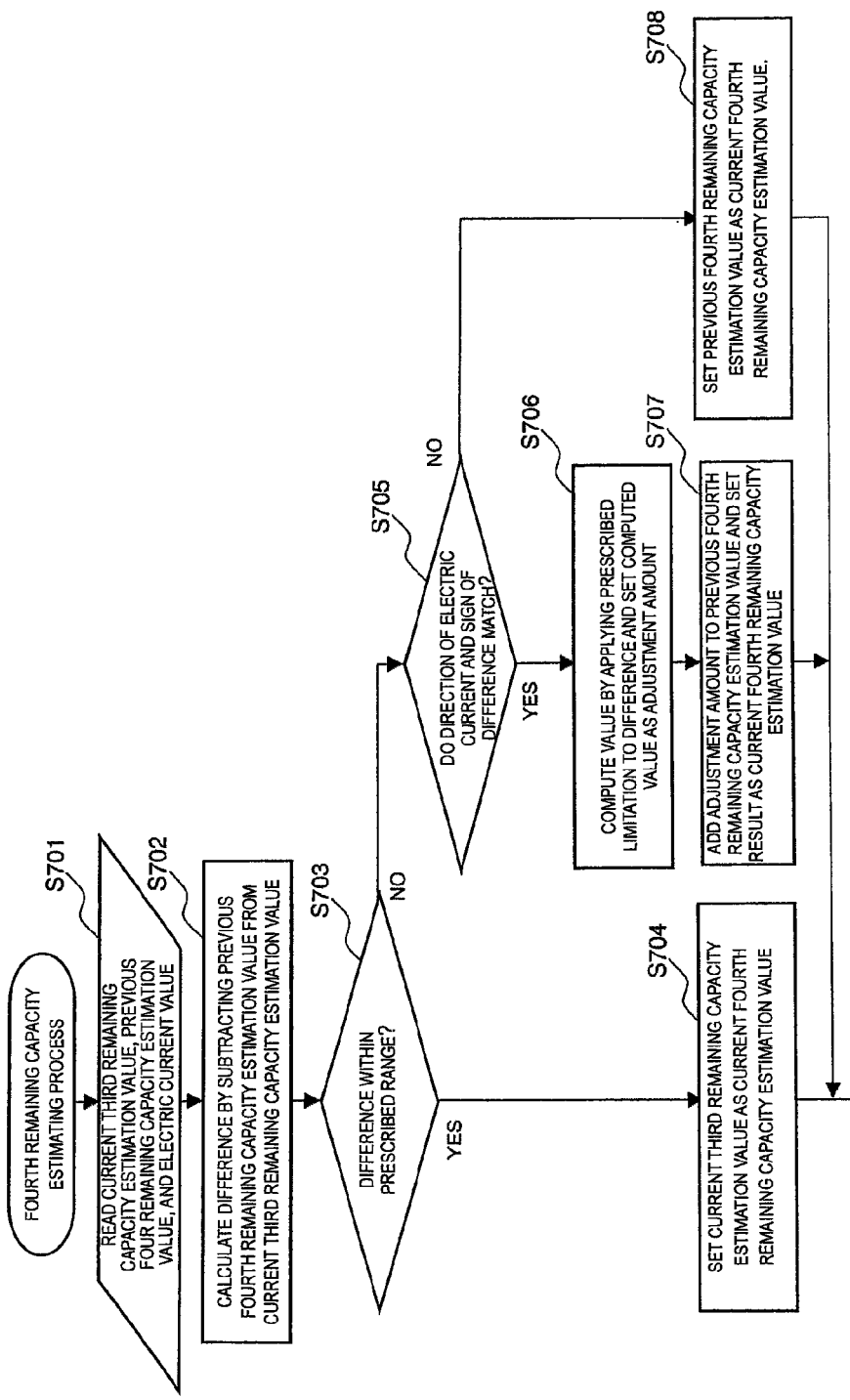
FIG. 11 is a flowchart showing the detailed steps of a fourth remaining capacity estimating process according to a second variation of the first embodiment.
Figure 12:
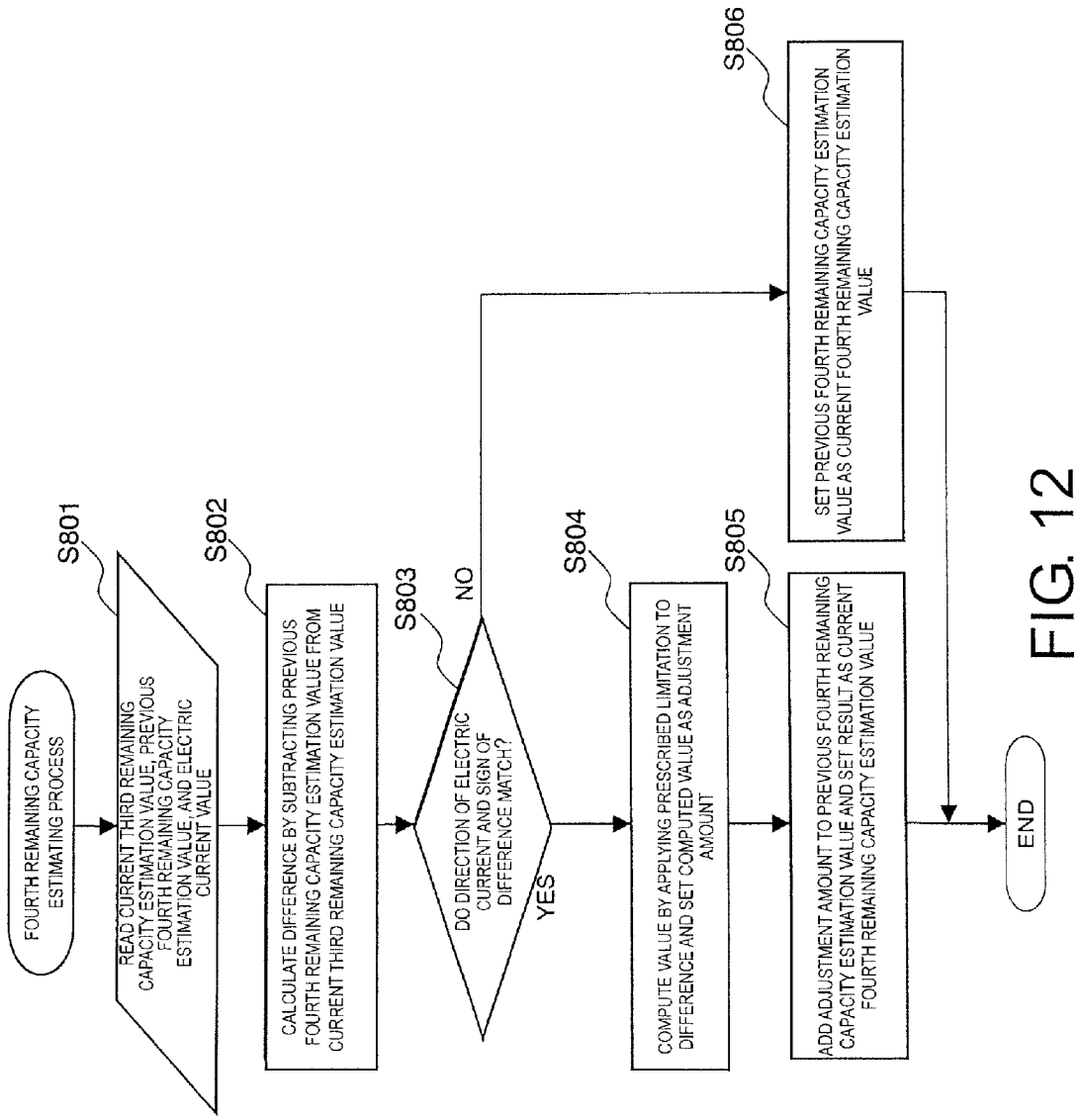
FIG. 12 is a flowchart showing the detailed steps of a fourth remaining capacity estimating process according to a third variation of the first embodiment.

First to third variations of the first embodiment will now be explained with reference to FIGS. 10 to 12 focusing chiefly on the differences with respect to the first embodiment. The first to third variations of the first embodiment only differ from the first embodiment in relation to the fourth remaining capacity estimating process. Thus, the fourth remaining capacity estimating processes of the first to third variations of the first embodiment will now be explained. FIG. 10 is a flowchart showing the detailed steps of a fourth remaining capacity estimating process according to the first variation of the first embodiment. FIG. 11 is a flowchart showing the detailed steps of a fourth remaining capacity estimating process according to the second variation of the first embodiment. FIG. 12 is a flowchart showing the detailed steps of a fourth remaining capacity estimating process according to the third variation of the first embodiment.

As shown in FIG. 10, the fourth remaining capacity estimating process of the first variation of the first embodiment is the same as the fourth remaining capacity estimating process of the first embodiment except that the step S503 has been removed. That is, as shown in FIG. 10, the steps S601 and S602 of the first variation are the same as the steps S501 and S502 of the first embodiment. The step S603 is the same as the step S505 of the embodiment. If the fourth remaining capacity estimating section determines that the direction of the electric current and the sign of the aforementioned difference are the same (i.e., if the result of the step S603 is Yes), then it proceeds to execute the processing of step S604, which is the same as the step S504 of the first embodiment. If the fourth remaining capacity estimating section determines that the direction of the electric current and the sign of the aforementioned difference are the same (i.e., if the result of the step S603 is No), then it proceeds to the processing of step S605, which is the same as the step S506 of the first embodiment. The fourth remaining capacity estimating section then ends the fourth remaining capacity estimating process of the first variation of the first embodiment. In this way, the first variation can achieve the same effects as the first embodiment.

As shown in FIG. 11, the fourth remaining capacity estimating process of the second variation of the first embodiment is the same as the fourth remaining capacity estimating process of the first embodiment except that it includes the additional steps S706 and S707. More specifically, as shown in FIG. 11, the steps S701 to S705 of the second variation are the same as the steps S501 to S505 of the first embodiment. If the fourth remaining capacity estimating section determines that the direction of the electric current and the sign of the aforementioned difference are not the same (i.e., if the result of the step S705 is No), then the remaining capacity estimating apparatus 20 executes the processing of step S708, which is the same as step S506 of the first embodiment. Meanwhile, if it determines that the direction of the electric current and the sign of the aforementioned difference match (i.e., if the result of step S705 is Yes), then the fourth remaining capacity estimating section proceeds to step S706. In step S706, the fourth remaining capacity estimating section applies a prescribed limitation value to the aforementioned difference. The resulting value is an adjustment value that will serve as an adjustment amount. It is acceptable to vary the prescribed limitation value depending on the remaining capacity of the secondary battery 1 and the electric current value. The fourth remaining capacity estimating section then adds the adjustment amount to a fourth remaining capacity estimation value of a previous control cycle and substitutes the resulting sum value as the fourth remaining capacity estimation value of the current control cycle (step S707). The fourth remaining capacity estimating section then ends the fourth remaining capacity estimating process of the second variation of the first embodiment.

Thus, in the second variation of the first embodiment, when the fourth remaining capacity estimating section limits the change of the third remaining capacity estimation value, it obtains an adjustment value by applying a prescribed limitation value to the aforementioned difference and reduces the aforementioned difference by adding the adjustment value to the third remaining capacity estimation value. In this way, the second variation can achieve the same effects as the first embodiment. Additionally, at the time tb shown in FIG. 8, the fourth remaining capacity estimation value of the current control cycle can be brought closer to the third remaining capacity estimation value of the current control cycle by an amount corresponding to the adjustment amount obtained by applying a prescribed limitation value to the difference. By causing the fourth remaining capacity estimation value to gradually approach the third remaining capacity estimation value, the occurrence of a situation in which the driver experiences a feeling that something is odd about the indicated remaining capacity can be suppressed even when the remaining capacity changes by a large amount.

As shown in FIG. 12, the fourth remaining capacity estimating process of the third variation of the first embodiment is the same as the fourth remaining capacity estimating process of the first embodiment, except that the step S503 has been removed. Additionally, steps S804 and S805 have been added in place of the step S504 of the first embodiment. More specifically, as shown in FIG. 12, the steps S801 and S802 of the third variation are the same as the steps S501 and S502 of the first embodiment. The step S803 is the same as the step S505 of the first embodiment. If the fourth remaining capacity estimating section determines that the direction of the electric current and the sign of the aforementioned difference are not the same (i.e., if the result of the step S803 is No), then fourth remaining capacity estimating section executes the processing of step S806, which is the same as step S506 of the first embodiment.

Meanwhile, if it determines that the direction of the electric current and the sign of the aforementioned difference match (i.e., if the result of step S803 is Yes), then the fourth remaining capacity estimating section proceeds to step S804. In step S804, the fourth remaining capacity estimating section applies a prescribed limitation to the aforementioned difference. The resulting value is an adjustment value that will serve as an adjustment amount. It is acceptable to change the prescribed limitation depending on the remaining capacity of the secondary battery 1 and the current value. The fourth remaining capacity estimating section then adds the adjustment amount to a fourth remaining capacity estimation value of a previous control cycle and substitutes the resulting sum value as the fourth remaining capacity estimation value of the current control cycle (step S805). The fourth remaining capacity estimating section then ends the fourth remaining capacity estimating process of the third variation of the first embodiment.

Thus, in the third variation of the first embodiment, when the fourth remaining capacity estimating section limits the change of the third remaining capacity estimation value (i.e., the selected estimation value), it obtains an adjustment value by applying a prescribed limitation to the aforementioned difference and reduces the aforementioned difference by adding the adjustment value to the third remaining capacity estimation value. In this way, the first variation can achieve the same effects as the first embodiment. Additionally, at the time tb shown in FIG. 8, the fourth remaining capacity estimation value of the current control cycle can be brought closer to the third remaining capacity estimation value of the current control cycle by an amount corresponding to the adjustment amount obtained by applying a prescribed limitation to said difference. By causing the fourth remaining capacity estimation value to gradually approach the third remaining capacity estimation value, the occurrence of a situation in which the driver experiences a feeling that something is odd about the indicated remaining capacity can be suppressed even when the remaining capacity changes by a large amount.

The embodiment and variations thereof described above are merely examples of working the invention and do not limit the scope of the invention. Various other embodiments can be achieved without departing from the scope of the invention as set forth in the embodiments.

For example, in the electric powered vehicle according to the first embodiment or any of the first to third variations thereof, the indicating device 7 is provided separately from the control device 2. However, the secondary battery remaining capacity estimating apparatus 20 is not limited to such an arrangement and it is acceptable for the indicating device 7 to be included in the secondary battery remaining capacity estimating apparatus 20.

In the electric powered vehicle according to the first embodiment and the first to third variations thereof, the current sensor 5 measures a charge current of the secondary battery 1 as a positive (+) value and a discharge current as a negative (−) value. However, the secondary battery remaining capacity estimating apparatus 20 is not limited to such an arrangement and it is acceptable to measure a charge current as a negative (−) value and a discharge current as a positive (+) value. In the first embodiment and the first to third variations of the first embodiment, reversing the sign of the electric current can be easily accommodated by subtracting the current third remaining capacity estimation value from the previous fourth remaining capacity estimation value.

Similarly, in the electric powered vehicle according to the first embodiment and the first to third variations thereof, the current sensor 5 measures a charge current of the secondary battery 1 as a positive (+) value and a discharge current as a negative (−) value. However, the secondary battery remaining capacity estimating apparatus 20 is not limited to such an arrangement and it is acceptable to measure a charge current as a negative (−) value and a discharge current as a positive (+) value. The reversing the sign of the electric current can be accommodated without changing the aforementioned difference value by reconstructing the control logic such that the direction of the electric current and the sign of the difference are determined to be different when the sign of the difference is positive (+) while the secondary battery 1 is charging and when the sign of the difference is negative (−) while the secondary battery 1 is discharging. In other words, the direction of the electric current and the sign of the difference are determined to match when the sign of the difference is negative (−) while the secondary battery 1 is charging or when the sign of the difference is positive (+) while the secondary battery 1 is discharging.

Although in the first embodiment and the first to third variations of the first embodiment the fourth remaining capacity estimating section determines if the secondary battery is charging or discharging based on the direction of the electric current, the secondary battery remaining capacity estimating apparatus 20 is not limited to such a method. It is acceptable for the remaining capacity estimating apparatus 20 to be provided with a separate and independent means of determining if the secondary battery 1 is charging or discharging. The control device 2 can also be provided separately and independently.

In the first embodiment and the first to third variations of the first embodiment, the first remaining capacity estimating section 2001 is contrived to estimate a remaining capacity of the secondary battery 1 using a current integration method. However, the secondary battery remaining capacity estimating apparatus 20 is not limited to using such a method and it is acceptable to use another method so long as it is different from the estimation method used by the second remaining capacity estimating section 2002. In the first embodiment and the first to third variations of the first embodiment, the second remaining capacity estimating section 2002 estimates a remaining capacity of the secondary battery 1 using an open circuit voltage method. However, the secondary battery remaining capacity estimating apparatus 20 is not limited to using such a method and it is acceptable to use another method so long as it is different from the estimation method used by the first remaining capacity estimating section 2001. Thus, it is acceptable for the first remaining capacity estimating section 2001 to employ an open circuit voltage method to estimate a remaining capacity and for the second remaining capacity estimating section 2002 to employ a current integration method.

Also, in the first embodiment and the first to third variations of the first embodiment, the fourth remaining capacity estimating section 2005 is contrived to cancel the aforementioned limitation when the secondary battery 1 is charging and the sign of the aforementioned difference is positive (+) and when the secondary battery 1 is discharging and the sign of the aforementioned difference is negative (−). However, the secondary battery remaining capacity estimating apparatus 20 is not limited to such a control scheme. For example, it is acceptable to cancel the limitation when the third remaining capacity estimation value (selected estimation value) changes in an increasing direction while the secondary battery 1 is charging and when the third remaining capacity estimation value (selected estimation value) changes in a decreasing direction while the secondary battery 1 is discharging. Such a control scheme can be achieved easily by storing the direction of the change in the third remaining capacity estimation value (selected estimation value) and comparing the stored direction to the direction of the electric current in step S505, S603, S705 or S803. It is also acceptable to cancel the limitation of the change of the third remaining capacity estimation value (selected estimation value) when the third remaining capacity estimation value is close to a usage limit range of the secondary battery 1, i.e., when the third remaining capacity estimation value is close to a limit of amount to which the secondary battery 1 can be charged or discharged. Examples of such a limit include states in which the remaining capacity is very small (e.g., the battery is charged to 20% or less) and states in which the remaining capacity is very large (i.e., 95% or higher).

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts.

As mentioned above, while only selected embodiments have been chosen to illustrate the present invention, it will be apparent to those skilled in the art from this disclosure that various changes and modifications can be made herein without departing from the scope of the invention as defined in the appended claims. Moreover, components that are shown directly connected or contacting each other can have intermediate structures disposed between them, unless otherwise indicated. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A secondary battery remaining capacity estimating apparatus comprising:
   a secondary battery;
   a charge/discharge determining section that determines if the secondary battery is charging or discharging;
   a remaining capacity estimating section that estimates a remaining electric power capacity of the secondary battery;
   a remaining capacity indicating section that indicates a remaining capacity of the secondary battery based on an estimation value by the remaining capacity estimating section; and
   a remaining capacity indication limiting section that
      limits a decrease of the remaining capacity being indicated by the remaining capacity indicating section when the charge/discharge determining section has determined that the secondary battery is charging and the estimation value obtained by the remaining capacity estimating section will decrease, and
      limits an increase of the remaining capacity being indicated by the remaining capacity indicating section when the charge/discharge determining section has determined that the secondary battery is discharging and the estimation value obtained by the remaining capacity estimating section will increase.

2. The secondary battery remaining capacity estimating apparatus as recited in claim 1, wherein
   the charge/discharge determining section determines if the secondary battery is charging or discharging based on a current value obtained with a current meter connected to the secondary battery.

3. The secondary battery remaining capacity estimating apparatus as recited in claim 1, wherein
   the remaining capacity estimating section includes
      a first remaining capacity estimating section that estimates a first remaining capacity value of the secondary battery using a first estimating method,
      a second remaining capacity estimating section that estimates a second remaining capacity of the secondary battery using a second estimating method that is different from the first estimation method used by the first remaining capacity estimating section, and
      a selecting section that selects either the first remaining capacity estimation value estimated by the first remaining capacity estimating section or the second remaining capacity estimation value estimated by the second remaining capacity estimating section in accordance with a usage condition of the secondary battery; and the remaining capacity display limiting section includes an estimation value change limiting section that limits a change of the first or second remaining capacity estimation value that was selected by the selecting section with respect to a previously set remaining capacity estimation value when the secondary battery is charging and the first or second remaining capacity estimation value that was selected will change in a decreasing direction with respect to the previously set remaining capacity estimation value, and when the secondary battery is discharging and the first or second remaining capacity estimation value that was selected will change in an increasing direction with respect to the previously set remaining capacity estimation value.

4. The secondary battery remaining capacity estimating apparatus as recited in claim 3, wherein the estimation value change limiting section cancels limiting the change of the first or second remaining capacity estimation value that was selected by the selecting section when the secondary battery is charging and the first or second remaining capacity estimation value that was selected will change in an increasing direction with respect to the previously set remaining capacity estimation value, and when the secondary battery is discharging and the first or second remaining capacity estimation value that was selected will change in a decreasing direction with respect to the previously set remaining capacity estimation value.

5. The secondary battery remaining capacity estimating apparatus as recited in claim 4, wherein the estimation value change limiting section calculates a difference between the first or second remaining capacity estimation value that was selected and the previously set remaining capacity estimation value, and decreases the difference by applying a prescribed limit to the difference so as to obtain an adjustment value and then adding the adjustment value that was obtained to the first or second remaining capacity estimation value that was selected when the limiting of the change of the first or second remaining capacity estimation value that was selected is cancelled.

6. The secondary battery remaining capacity estimating apparatus as recited in claim 3, wherein the estimation value change limiting section holds the previously set remaining capacity estimation value when the secondary battery is charging and the first or second remaining capacity estimation value that was selected will change in a decreasing direction with respect to the previously set remaining capacity estimation value, and when the secondary battery is discharging and the first or second remaining capacity estimation value that was selected will change in an increasing direction with respect to the previously set remaining capacity estimation value.

7. The secondary battery remaining capacity estimating apparatus as recited in claim 6, wherein the estimation value change limiting section cancels the limiting of the change of the first or second remaining capacity estimation value when the first or second remaining capacity estimation value that was selected substantially equals the previously set remaining capacity estimation value.

8. The secondary battery remaining capacity estimating apparatus as recited in claim 3, wherein the estimation value change limiting section cancels the limiting of the change of the first or second remaining capacity estimation value when a difference between the first or second remaining capacity estimation value that was selected and the previously set remaining capacity estimation value decreases.

9. The secondary battery remaining capacity estimating apparatus as recited in claim 3, further comprising a charge/discharge control device that control charging and discharging of the secondary battery, with the charge/discharge control device executing a charge/discharge control of the secondary battery based on a selected remaining capacity estimation value that has not been limited by the estimation value change limiting section when the selecting section selects one of the first and second remaining capacity estimation values.

10. The secondary battery remaining capacity estimating apparatus as recited in claim 3, wherein the estimation value change limiting section cancels the limiting of the change of the first or second remaining capacity estimation value that was selected by the selecting section when the first or second remaining capacity estimation value that was selected is close to a battery usage limit range.

11. The secondary battery remaining capacity estimating apparatus as recited in claim 3, wherein the first remaining capacity estimating section calculates an amount of change of the remaining capacity based on a value of a current flowing to or from the secondary battery and then estimates the first remaining capacity estimation value of the secondary battery based on the amount of change that was calculated.

12. The secondary battery remaining capacity estimating apparatus as recited in claim 3, wherein the second remaining capacity estimating section estimates an open circuit voltage of the secondary battery and then estimates the second remaining capacity estimation value of the secondary battery based on the open circuit voltage that was estimated.

13. A secondary battery remaining capacity estimating method comprising:

determining if a secondary battery is charging or discharging;

estimating a remaining electric power capacity of the secondary battery;

displaying a remaining capacity of the secondary battery based on an estimation value that was previously estimated;

limiting display of a decrease of a remaining capacity upon determining that the secondary battery is charging and the estimation value will decrease; and limiting display of an increase of a remaining capacity indicated upon determining that the secondary battery is discharging and the estimation value will increase.

14. The method as recited in claim 13, wherein the determining of if the secondary battery is charging or discharging is based on a current value obtained with a current meter connected to the secondary battery.

15. The method as recited in claim 13, wherein the estimating of the electric power capacity of the secondary battery is performed by estimating a first remaining capacity of the secondary battery using a first estimation method, estimating a second remaining capacity of the secondary battery using a second estimating method that is different from a first estimation method, and selecting either a first remaining capacity estimation value estimated by the first estimation method or a second remaining capacity estimation value estimated by the second estimation method in accordance with a usage condition of the secondary battery; and the limiting of the display of the remaining capacity is performed by limiting a change of the first or second remaining capacity estimation value that selected with respect to a previously set remaining capacity estimation value when the secondary battery is charging and the first or second remaining capacity estimation value that was selected will change in a decreasing direction with respect to the previously set remaining capacity estimation value, and when the secondary battery is discharging and the first or second remaining capacity estimation value that was selected will change in an increasing direction with respect to the previously set remaining capacity estimation value.

16. The method as recited in claim 15, wherein the limiting of the display of the remaining capacity includes canceling the limiting of the change of the first or second remaining capacity estimation value that was selected when the secondary battery is charging and the first or second remaining capacity estimation value that was selected will change in an increasing direction with respect to the previously set remaining capacity estimation value, and when the secondary battery is discharging and the first or second remaining capacity estimation value that was selected will change in a decreasing direction with respect to the previously set remaining capacity estimation value.

17. The method as recited in claim 15, wherein the limiting of the display of the remaining capacity includes canceling the limiting of the change of the first or second remaining capacity estimation value that was selected when a difference between the first or second remaining capacity estimation value that was selected and the previously set remaining capacity estimation value decreases.

18. The method as recited in claim 15, wherein the limiting of the display of the remaining capacity includes canceling the limiting of the change of the first or second remaining capacity estimation value that was selected when the first or second remaining capacity estimation value that was selected is close to a battery usage limit range.

19. The method as recited in claim 15, wherein the estimating of the first remaining capacity includes calculating an amount of change of the remaining capacity based on a value of a current flowing to or from the secondary battery and then estimating the first remaining capacity estimation value of the secondary battery based on the amount of change that was calculated.

20. The method as recited in claim 15, wherein the estimating of the second remaining capacity includes estimating an open circuit voltage of the secondary battery and then estimating the second remaining capacity estimation value of the secondary battery based on the open circuit voltage that was estimated.

* * * * *